(12) United States Patent  
Choi

(10) Patent No.: US 6,281,512 B1
(45) Date of Patent: Aug. 28, 2001

(54) ION IMPLANTATION SYSTEM HAVING DIRECT AND ALTERNATING CURRENT SOURCES

(75) Inventor: Ki-cheol Choi, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/339,871

(22) Filed: Jun. 25, 1999

(30) Foreign Application Priority Data

Jul. 2, 1998 (KR) .................................................. 98-26616

(51) Int. Cl.$^7$ .................................................. H01J 37/317
(52) U.S. Cl. .................................................. 250/492.21
(58) Field of Search ............................ 250/492.21, 423 R

(56) References Cited

U.S. PATENT DOCUMENTS 6,130,436 * 10/2000 Renau et al. .................. 250/492.21

\* cited by examiner

*Primary Examiner*—Kiet T. Nguyen
(74) *Attorney, Agent, or Firm*—Jones Volentine, PLLC

(57) ABSTRACT

A pre-acceleration or post-acceleration ion implantation system includes an AC (alternating current) power source supplying power in tandem with a DC (direct current) power source. The combined AC and DC power may be supplied, in alternative embodiments, to an ion accelerator and/or an ion extractor of the system.

14 Claims, 9 Drawing Sheets

ION IMPLANTATION SYSTEM HAVING DIRECT AND ALTERNATING CURRENT SOURCES

BACKGROUND OF THE INVENTION

1. Field of the Invention

The present invention relates generally to an ion implantation system, and more particularly, to an ion implantation system in which the concentration of injected ions is uniform within the target.

2. Description of the Related Art

Ion implantation is a technique for implanting atomic ions into a target by imparting enough energy to the ions for them to penetrate the surface of a target, such as a silicon wafer.

Typical ion implantation systems in a semiconductor device manufacturing line are capable of regulating the concentration of an ion impurity in the range of $10^{14}$~$10^{18}$ atoms/cm$^3$. This is an improvement over previous methods such as ion concentration regulation through diffusion. Ion implantation systems are widely used, particularly as the level of integration of semiconductor devices increases, due to their ability to inject the ion impurities to a precise depth.

In general, conventional ion implantation systems comprise a number of components, including an ion source, an ion mass analyzer, and an ion accelerator. At each of these components, power of various levels is applied. Ions generated from an ion source containing source gas are accelerated due to the applied power. The accelerated ions are injected into a wafer placed on the end station.

The voltage levels applied to respective components of the ion implantation system greatly affect the operation of the system. The voltage levels are varied based on factors such as the characteristics of the extraction, the acceleration, and the analysis. The voltage level used is an important factor in determining the dose (i.e., the applied concentration) of the ions to the wafer.

In the conventional ion implantation system, an equal level of high is direct voltage is applied to the ion extractor and the ion accelerator. These components extract and accelerate ions before injection into the target whether they are being used in a pre-acceleration system where extracted ions are accelerated before being mass-analyzed, or in a post-acceleration system, where extracted ions are accelerated after mass-analysis.

A more detailed description of the above described ion implantation systems will now be undertaken with reference to FIGS. 1a–3.

FIG. 1a is a schematic diagram illustrating a "post-acceleration" ion implantation system 100. Ions are supplied from an ion supply source 10 having impurities in a gas or solid form, and extracted by an ion-extractor 12, to which a high voltage is applied. The extracted ion beam 16 includes ions of different masses, which then enter a mass analyzer 14. Mass analyzer 14 selects ions having a specific mass.

The selected ions enter ion accelerator 18 where they are accelerated to a predetermined energy. The accelerated ion beam 16 is injected into wafer 24 mounted on end station 22.

Ion extractor 12, mass analyzer 14, and ion accelerator 18 are shown in more detail in FIG. 1b. Ion extractor 12 is connected to a variable DC power source 26, mass analyzer 14 is connected to a power source 28, and ion accelerator 18 is connected to variable DC power source 30. Power sources 26, 28, and 30 supply power based on the weight of the ions and the desired ion implantation process. A specific power value set at any one of power sources 26, 28, and 30 corresponds to specific values at the other two power sources.

In the conventional ion implantation system 100, DC power is applied to ion extractor 12 and ion accelerator 18. A concentration distribution of ions injected into wafer 24 versus the depth of the ions in wafer 24 is shown in FIG. 3. For example, when boron ions (B+) are implanted in the wafer with an acceleration energy of 130 keV, the highest values of the concentration dose (1.9E+17 atoms/cm$^3$) occur a certain depth into the wafer (4.0E–7 m). Ion implantation system 100 works well when it is being used to inject the highest concentration of impurities at a specific depth.

An ion implantation system 200 using the conventional "pre-acceleration method" is shown in FIGS. 2a and 2b. System 200 is similar to system 100, the primary difference being that the ion accelerator 18 is placed before the mass analyzer 14. In particular, DC power sources 26 and 30 are connected to an ion extractor 12 and an ion accelerator 18. A detailed description of implantation system 200 is omitted because of its similarity to implantation system 100.

The ion implantation process using the pre-acceleration ion implantation system 200 exhibits process characteristics similar to those of post-acceleration ion implantation system 100. That is, the graph of FIG. 3 applies to ion implantation system 200 as well as ion implantation system 100.

Conventional attempts to implant a uniform concentration of impurities at a specified depth range often did not produce satisfactory results because, as shown in FIG. 3, the peak ion concentration occurs in a very narrow positional range in the wafer. To achieve uniform concentration at a specified depth range the implantation process was typically performed repeatedly with the acceleration energy varied in each process.

As described above, the conventional ion implantation process for implanting a specific dose throughout a certain range of depths required varying the acceleration energy values used in the implantation process and repeating the ion implantation process, resulting in wasted process time and decreased productivity.

SUMMARY OF THE INVENTION

The present invention provides an ion implantation system that injects a uniform ion dose to a constant depth of an implanted target by applying both DC (direct current) and AC (alternating current).

More specifically, one aspect of the present invention is directed to an ion implantation system comprising an ion extractor extracting ions from an ion supply based on application of power from one of a variable direct current power source, and a first direct current power source and a first alternating current power source; a mass analyzer receiving the extracted ions and separating the extracted ions based on weight; and an ion accelerator accelerating ions received from the mass analyzer by applying power to the ions from a second direct current power source and a second alternating current power source.

A second aspect of the present invention is directed to an ion implantation system including an ion extractor extracting ions from an ion supply based on application of power from a direct current power source and an alternating current power source; a mass analyzer receiving the extracted ions and separating the extracted ions based on weight; and an ion accelerator for accelerating ions received from the mass analyzer by applying power to the ions from a variable direct current power source.

A third aspect of the present invention is directed to an ion implantation system including an ion extractor extracting ions from an ion supply using power from one of a variable direct current power source, and a first direct current power source and a first alternating current power source; an ion accelerator accelerating ions received from the ion extractor by applying power to the received ions from a second direct current power source and a second alternating current power source; and a mass analyzer receiving the accelerated ions and separating the extracted ions based on weight.

A fourth aspect of the present invention is directed to an ion implantation system including an ion extractor extracting ions from an ion supply using power from a direct current power source and an alternating current power source; an ion accelerator accelerating ions received from the ion extractor by applying power to the received ions from a variable direct current power source; and a mass analyzer receiving the accelerated ions and separating the extracted ions based on weight.

BRIEF DESCRIPTION OF THE DRAWINGS

These and other objects, feature and advantages of the present invention will be described with reference to the accompanying drawings, in which.

DETAILED DESCRIPTION OF THE PREFERRED EMBODIMENTS

Reference will now be made in detail to embodiments of the invention, examples of which are illustrated in the accompanying drawings. Wherever possible, the same reference numbers will be used throughout the drawings to refer to the same or like parts.

A first embodiment consistent with the present invention relates to an ion implantation system using the post-acceleration method. In the post-acceleration method, ions are extracted from a gas, mass-analyzed, and then accelerated for injection into a wafer.

Figure 1A:
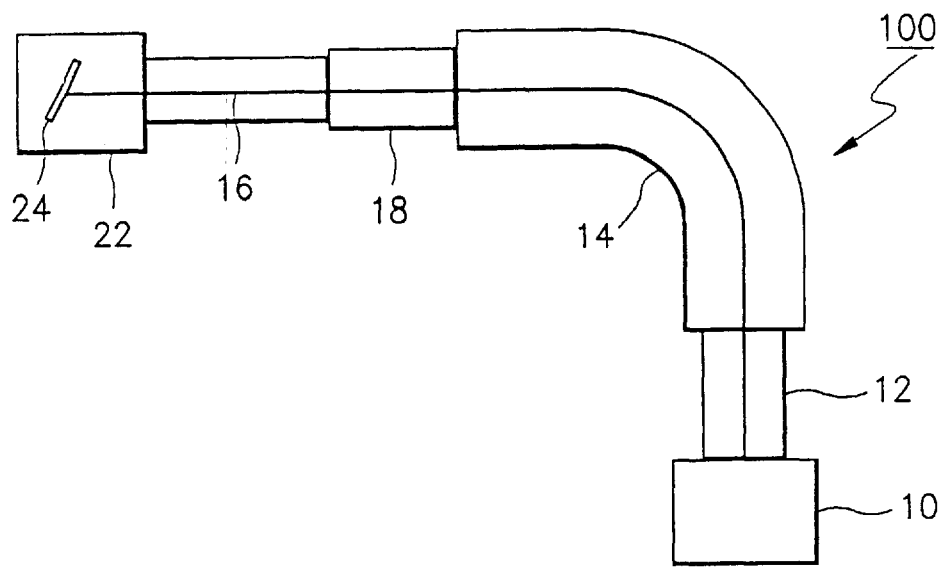
FIGS. 1a and 1b are schematic diagrams of a post-acceleration ion implantation system.
Figure 1B:
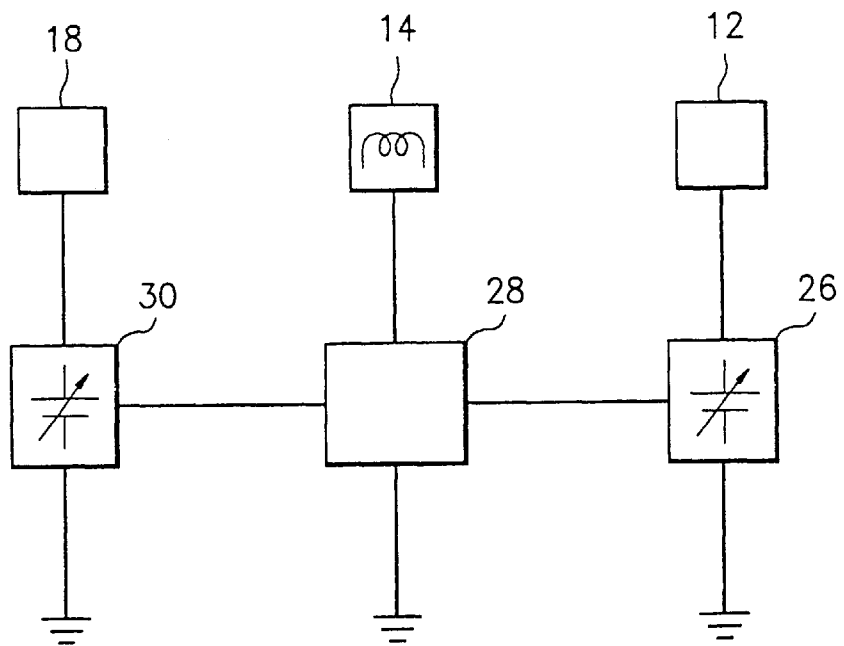
Figure 2A:
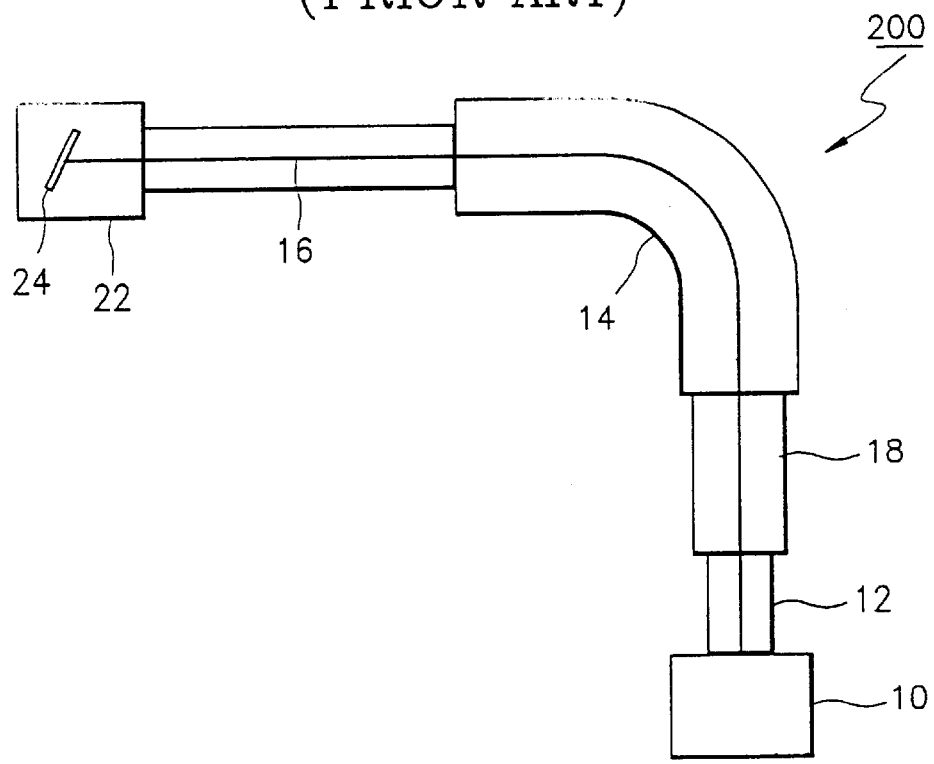
FIGS. 2a and 2b are schematic diagrams of a pre-acceleration ion implantation system.
Figure 2B:
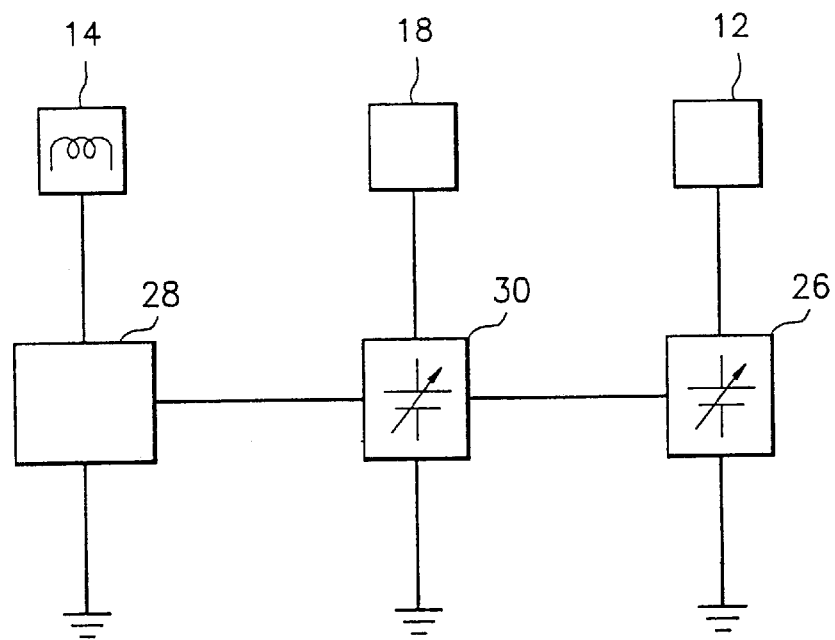
Figure 3:
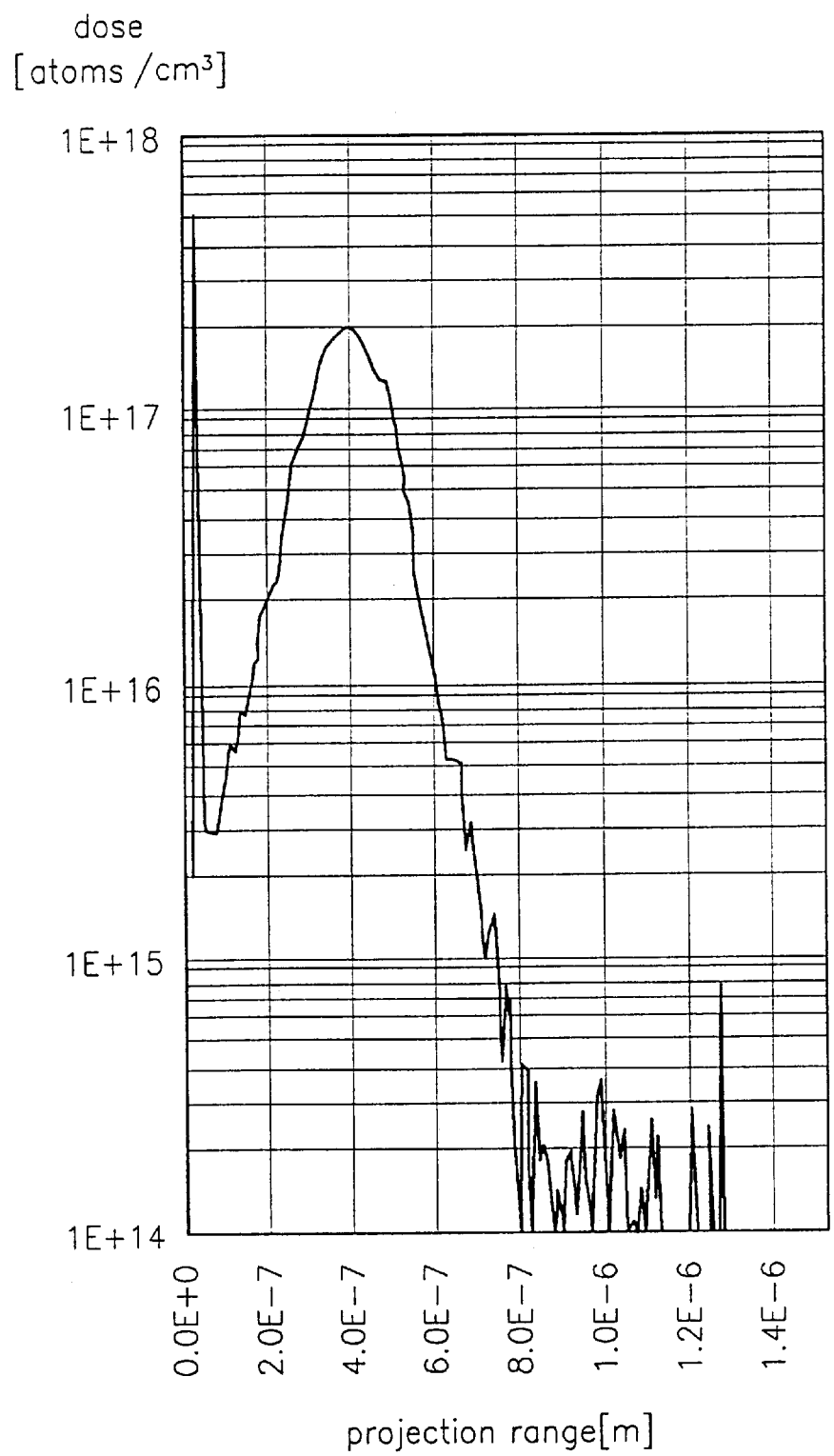
FIG. 3 is a graphical representation showing correlations of dose and projection range using the systems shown in FIGS. 1 and 2.
Figure 4:
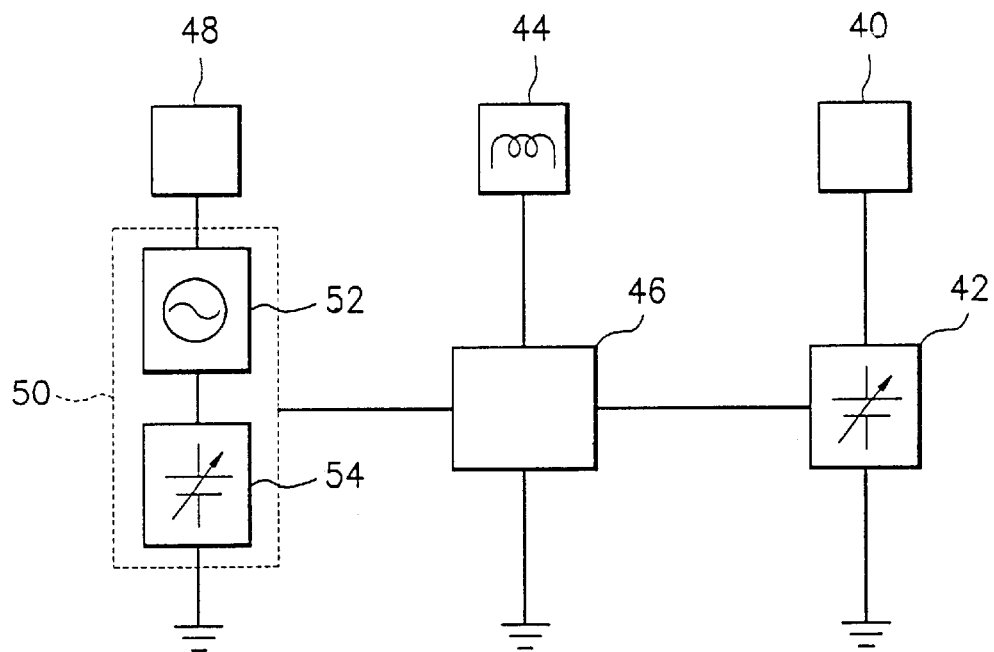
FIG. 4 schematically shows one embodiment of an ion implantation system by post-acceleration method according to the present invention.

As shown in FIG. 4, a variable DC power supply 42 is connected to ion extractor 40. A power source 46 is connected to mass analyzer 44 and applies power to the analysis coils of the mass analyzer. DC power source 54 and AC power source 52 are connected to ion accelerator 48. Both DC power source 54 and AC power source 52 are variable output power sources that together constitute power selecting part 50. These power sources 42, 46, 50 are all connected for feed-back based on a set power value. That is, if one of power sources 42, 46, and 50 is adjusted, the others change their output values accordingly.

Extracted ions form an ion beam that enters mass analyzer 44, which selects ions based on the constant diameter of the refraction with respect to the weight of the ions.

After the extracted ions pass through the mass analyzer 44 they enter ion accelerator 48, where the ions get energy from power selecting part 50 and are accelerated. More particularly, DC power source 54 and AC power source 52 apply energy to ion accelerator 48.

The acceleration energy delivered to ion accelerator 48 by DC power source 54 and AC power source 52 varies with time, and accordingly, the acceleration of the ions and the depth of their injection into the wafer varies. The AC power source 52 may be a typical AC (alternating current) power source or an AC high frequency power source. The DC power source 54 is a typical DC (direct current) power source, and may include a ripple power source.

Figure 7:
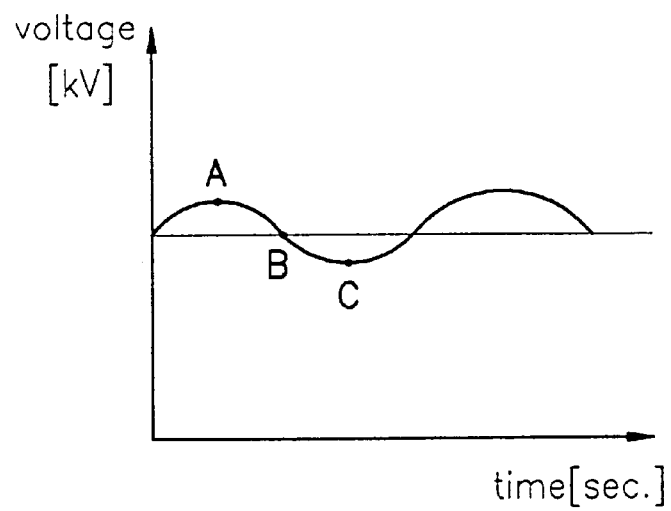
FIG. 7 is a graphical representation of the applied state of the AC power and the DC power according to the present invention.

FIG. 7 is a graph illustrating variation of power supplied by power selecting part 50. The power value at the point labeled "A" indicates a maximum power value and correspondingly, a maximum acceleration energy applied on the ion beam. The power value at the point labeled "B" corresponds to power from only DC power source 54, and at the point labeled "C", the applied power and acceleration energy is lower than the value at "A" or "B." Because the depth of the ions injected into the wafer vary according to their acceleration energy, and the acceleration energy, as shown in FIG. 7, varies with time, the depth of the implanted ions vary with time. As can be seen from the graph of FIG. 7, the mean value of the power supplied by the alternating current source is approximately zero.

Figure 8:
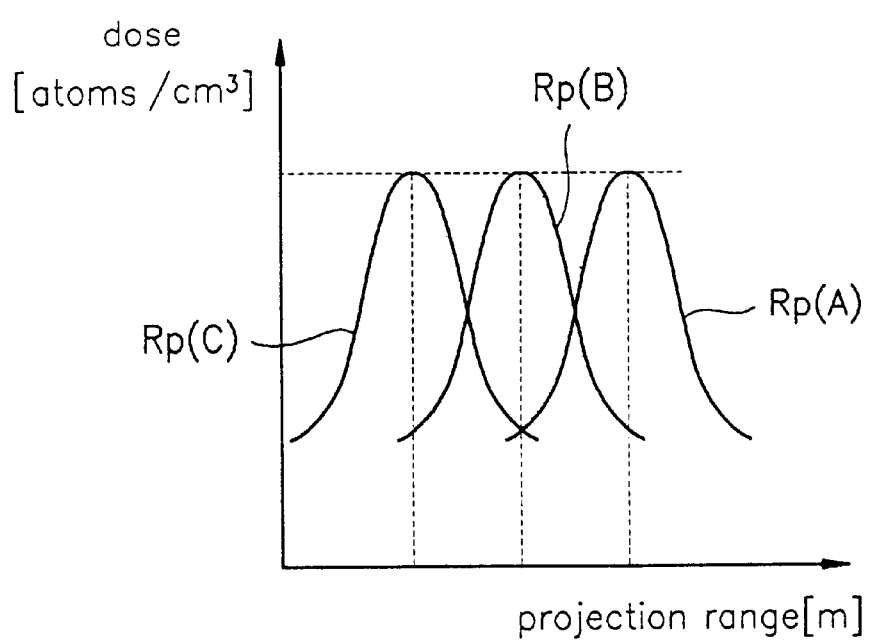
FIG. 8 is a graphical representation showing the correlation of the dose and the projection ranges achieved using the wave form of FIG. 7.

FIG. 8 is a graph of the projection range (referred to as Rp) of the ions corresponding to the ions at the voltage values "A", "B", and "C", labeled as Rp(A), Rp(b), and Rp(C), respectively. Three curves are shown in the graph. Curve Rp(A) illustrates the projection range versus dose profile when the applied voltage has value "A". Similarly, Rp(B) and Rp(C) are curves illustrating the projection range versus dose profile when the applied voltage has values "B" and "C".

Figure 5:
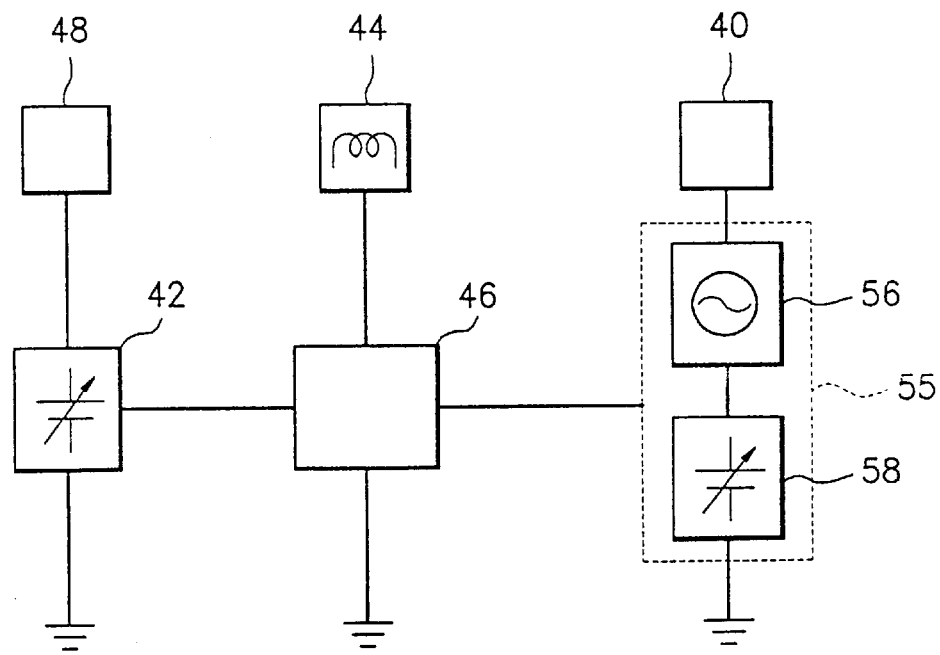
FIG. 5 schematically shows an embodiment of a post-acceleration ion implantation system according to the present invention.

FIG. 5 schematically illustrates a second embodiment consistent with the present invention, in which a DC power source and an AC power source are simultaneously applied to the ion extractor of an ion implantation system using the post-acceleration method. Power selecting part 55 comprises an AC power source 56 and a DC power source 58, both of which apply power to ion extractor 40. Power source 46 is connected to mass analyzer 44 so as to apply power to the analysis coils. DC power source 42 is connected to ion accelerator 48.

The operation of the embodiment shown in FIG. 5 is similar to that of the embodiment shown in FIG. 4, the primary difference being that a combination AC/DC power source is applied at ion extractor 40 instead of at ion accelerator 48. More particularly, ions are extracted from the ion extractor 40 and enter mass analyzer 44. In the mass analyzer 44, power from power source 46 is applied to the analysis coils thereof so that only ions of a specific mass pass through the magnetic field formed by the coils. The ion beam passing through the mass analyzer 44 enters ion accelerator 48, is accelerated by the power applied from DC power source 42, and enters the wafer.

Performing ion implantation using the system of FIG. 5 produces results similar to using the ion implantation system of FIG. 4. These results are shown in FIGS. 7 and 8 (described above). As shown in the dose versus projection range profile of FIG. 9, the constant dose projection range is achieved which extends from about 3E−7 meters to about 5E−7 meters and has a does of about $1E+17$ atoms/cm$^3$.

Figure 6:
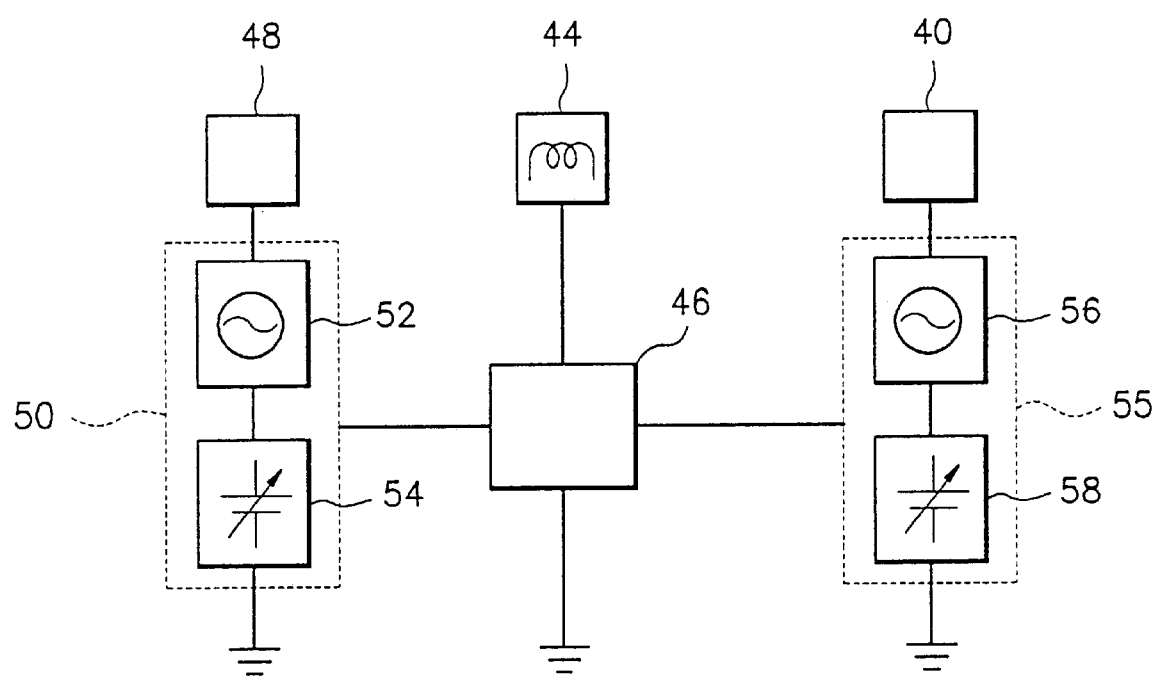
FIG. 6 schematically shows another embodiment of a post-acceleration ion implantation system according to the present invention.

An ion implantation system using concepts from the first and second embodiments is illustrated in FIG. 6, wherein AC power sources 56 and 52 and DC power sources 58 and 54 are connected to ion extractor 40 and to ion accelerator 48 respectively.

The power values applied from AC power sources 56 and 52 and DC power sources 58 and 54 are variable. If the power value of one is set, the power values of the others automatically change to appropriate corresponding values.

Figure 9:
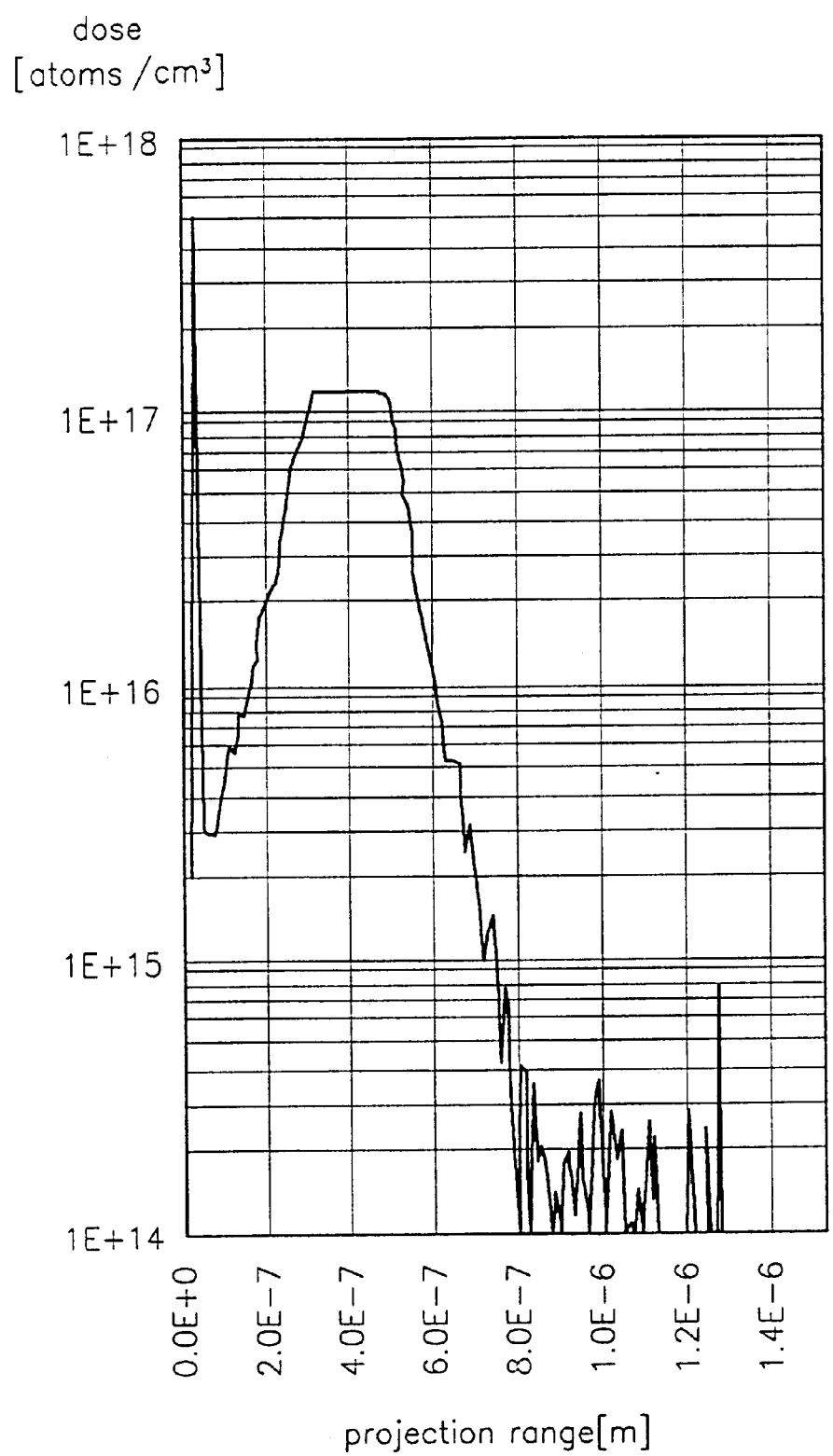
FIG. 9 is a graph of a SIMS procedure.

As with the first and second embodiments, the operation characteristics of the system of FIG. 6 are illustrated in FIGS. 7–9.

The first and second embodiments and the combination of the first and second embodiments as described above, were implemented using a post-acceleration ion implanter. Additional embodiments consistent with the present invention, implemented in a pre-acceleration ion implanter, will now be described, referring to FIGS. 10 through 12.

Figure 10:
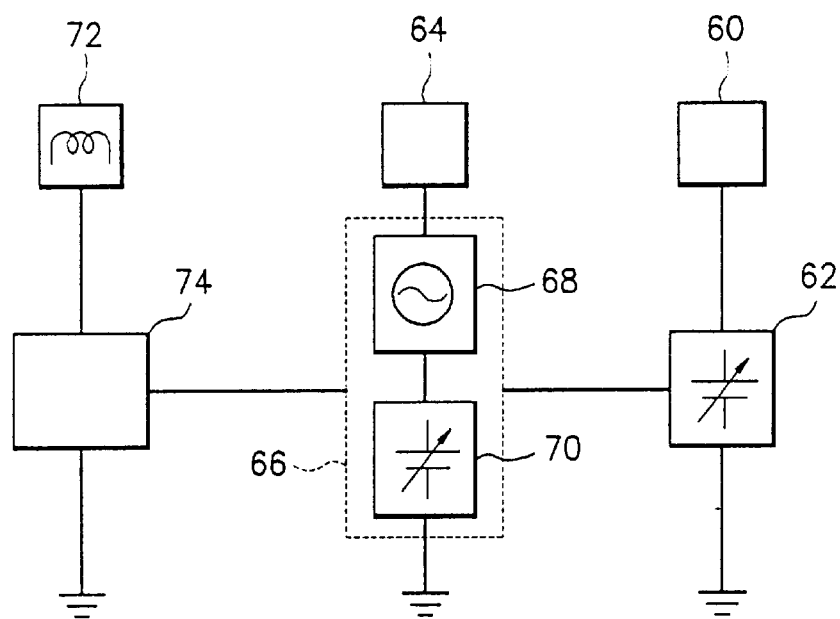
FIG. 10 schematically shows an embodiment of a pre-acceleration ion implantation system according to the present invention.

FIG. 10 illustrates a third embodiment consistent with the present invention having a DC power source 62 supplying power to an ion extractor 60; a power selecting part 66 for supplying power to ion accelerator 64, the power selecting part 66 including an AC power source 68 and a DC power source 70; and a power source 74 connected to the analysis coils of a mass analyzer 72. In this third embodiment, the extracted ions are accelerated before entering mass analyzer 72.

An ion beam extracted from ion extractor 60 is accelerated in ion accelerator 64. DC power source 70 and AC power source 68 are connected to ion accelerator 64. The ions receive acceleration that varies with respect to time. The ions enter mass analyzer 72, where specific ions are selected and then injected into the wafer.

FIGS. 7–9 illustrate the operation characteristics of the embodiment shown in FIG. 10.

Figure 11:
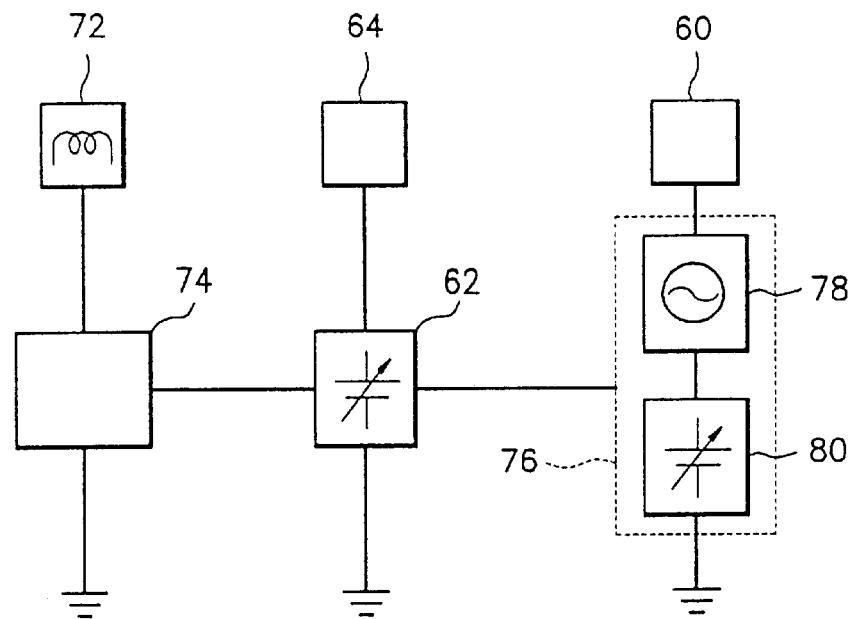
FIG. 11 schematically shows another embodiment of a pre-acceleration ion implantation system according to the present invention.

FIG. 11 illustrates a fourth embodiment of an ion implantation system consistent with the present invention using the pre-acceleration method. In this embodiment, a DC power source and an AC power source are connected to ion extractor 60. As shown in FIG. 11, a power selecting part 76 comprises an AC power source 78 and a DC power source 80, which together supply power to ion extractor 60. DC power source 62 is connected to ion accelerator 64. Power source 74 is connected to the analysis coils of the mass analyzer 72, wherein ions are mass-analyzed based on their weight by the magnetic field formed by the coils.

Again, FIGS. 7–9 illustrate the operation characteristics of the embodiment shown in FIG. 11.

Figure 12:
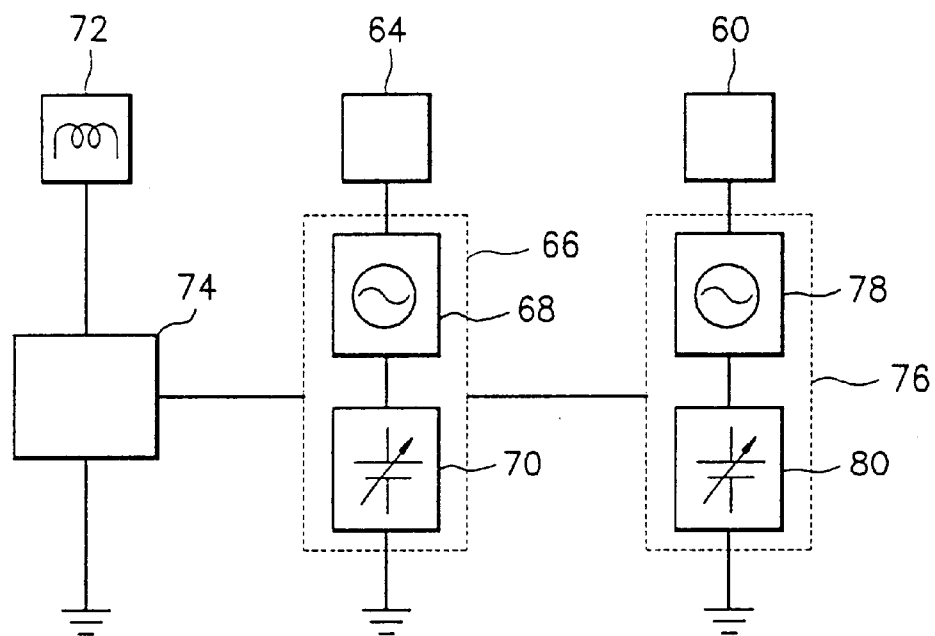
FIG. 12 schematically shows yet another embodiment of a pre-acceleration ion implantation system according to the present invention.

A system functioning in a manner similar to the ion implantation system using concepts from the third and fourth embodiments is illustrated in FIG. 12, wherein ion extractor 60 and ion accelerator 64 of the ion implantation system are connected to the DC power sources 80 and 70 and AC power sources 78 and 68. DC power source 80 and AC power source 78 are connected to ion extractor 60, DC power source 70 and AC power source 68 are connected to ion accelerator 64. Power source 74 is connected to the mass analyzer 72. AC power sources 78 and 68 and DC power sources 80 and 70 supply power when the ions are extracted and accelerated. Because AC power supply 68 is applied to the ion beam with DC power 70 while the ion beam is accelerated, the energy of the injected ion beam is also varied.

Figure 13:
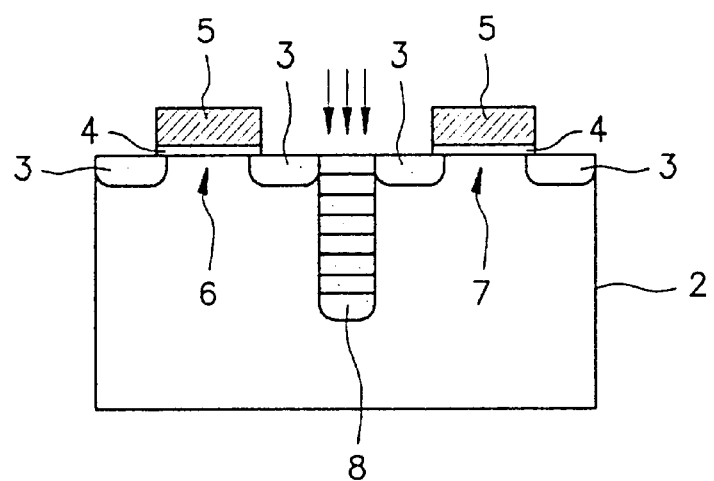
FIG. 13 is a cross-sectional view showing the semiconductor device fabricated using the ion implantation system of the present invention with its device isolation region formed thereon.

An example of ion implantation in a wafer is shown in FIG. 13. A device isolation region 8 isolates two active regions 6 and 7 formed on a substrate 2. Based on the voltage supplied to gate electrode 5, a current flow in an impurity implanted layer 3 is formed under gate oxide layer 4. The device isolation region 8 is formed between the two active regions 6 and 7 so that the devices do not affect each other. According to the above described first through fourth embodiments, the device isolation region 8 is formed with a varied supply of DC and AC current.

In the described first through fourth embodiments, ion focus and ion implant uniformity can be controlled by measuring the voltage of the ion extractor and the ion accelerator, and adjusting the components of the ion implantation system.

In summary, consistent with the present invention, AC and DC power are both applied to the ion extractor and the ion accelerator of an ion implantation system using either ion pre-acceleration or ion post-acceleration so that the acceleration energy varies with time, and the injected ions are uniformly distributed with a constant concentration throughout a specific depth range. Accordingly, the characteristics of the manufactured semiconductor devices improve and current leakage is prevented due to improved insulation. Further, only a single ion implantation process is performed.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. An ion implantation system comprising:
   an ion extractor extracting ions from an ion supply based on application of power from one of a variable direct current power source, and a first direct current power source and a first alternating current power source;
   a mass analyzer receiving the extracted ions and separating the extracted ions based on weight; and
   an ion accelerator accelerating ions received from the mass analyzer by applying power to the ions from a second direct current power source and a second alternating current power source.

2. The ion implantation system of claim 1, wherein the first and second alternating current power sources supply high frequency power.

3. The ion implantation system of claim 1, wherein the first and second alternating current power sources supply power having a mean value of approximately zero and the first and second direct current power sources supply power having a ripple.

4. The ion implantation system of claim 1, wherein the first and second direct current power sources and the first and second alternating current power sources have variable output values.

5. An ion implantation system comprising:
- an ion extractor extracting ions from an ion supply based on application of power from a direct current power source and an alternating current power source;
- a mass analyzer receiving the extracted ions and separating the extracted ions based on weight; and
- an ion accelerator for accelerating ions received from the mass analyzer by applying power to the ions from a variable direct current power source.

6. The ion implantation system of claim 5, wherein the direct current power source and the alternating current power source are variable power supplies.

7. An ion implantation system comprising:
- an ion extractor extracting ions from an ion supply using power from one of a variable direct current power source, and a first direct current power source and a first alternating current power source;
- an ion accelerator accelerating ions received from the ion extractor by applying power to the received ions from a second direct current power source and a second alternating current power source; and
- a mass analyzer receiving the accelerated ions and separating the extracted ions based on weight.

8. The ion implantation system of claim 7, wherein the first and second alternating current power sources supply high frequency power.

9. The ion implantation system of claim 7, wherein the mean value of the first and second alternating current power sources are approximately zero and the first and second direct current power sources supply power having a ripple.

10. The ion implantation system of claim 7, wherein the first and second direct current power sources and the first and second alternating current power sources are variable output power sources.

11. The ion implantation system of claim 7, wherein the power applied to the ion extractor has a value based on power supplied to the ion accelerator.

12. An ion implantation system comprising:
- an ion extractor extracting ions from an ion supply using power from a direct current power source and an alternating current power source;
- an ion accelerator accelerating ions received from the ion extractor by applying power to the received ions from a variable direct current power source; and
- a mass analyzer receiving the accelerated ions and separating the extracted ions based on weight.

13. The ion implantation system of claim 12, wherein the direct current power source and the alternating current power source are variable power sources that supply power to the ion accelerator.

14. The ion implantation system of claim 12, wherein the power applied to the ion accelerator has a value based on power supplied to the ion extractor.

* * * * *